(12) United States Patent
Okita et al.

(10) Patent No.: US 6,733,321 B2
(45) Date of Patent: May 11, 2004

(54) ELECTRICAL CONNECTOR HAVING DRIVING CAM

(75) Inventors: Masao Okita, Furukawa (JP); Hsiu-Yuan Hsu, Tu-Chen (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/287,998

(22) Filed: Nov. 4, 2002

(65) Prior Publication Data

US 2003/0228785 A1 Dec. 11, 2003

(30) Foreign Application Priority Data

Jun. 6, 2002 (TW) ........................................ 91208389 U

(51) Int. Cl.[7] ................................................. H01R 4/50
(52) U.S. Cl. ........................................................ 439/342
(58) Field of Search .............................. 439/342, 263, 439/264, 268

(56) References Cited

U.S. PATENT DOCUMENTS

| | | | |
|---|---|---|---|
| 5,707,247 A | * | 1/1998 | Konstad ...................... 439/342 |
| 6,146,178 A | | 11/2000 | Walkup et al. |
| 6,231,366 B1 | | 5/2001 | Pei et al. |
| 6,250,941 B1 | | 6/2001 | Huang et al. |
| 6,254,415 B1 | * | 7/2001 | Mizumura et al. .......... 439/342 |

* cited by examiner

*Primary Examiner*—Neil Abrams
*Assistant Examiner*—Phuong K Dinh
(74) *Attorney, Agent, or Firm*—Wei Te Chung

(57) ABSTRACT

An electrical connector (1) includes a base (2) having a number of passageways (21) receiving a corresponding number of terminals (6) therein, a cover (3) slidably mounted on the base and having a number of through holes (31), and a driving cam (4) extending through and rotatably assembled onto the base and the cover. The base defines a base hole (221) at one end thereof. The cover defines a cover hole (321) aligning with and communicating with the base hole and the cover hole defines a braking section (3211). The driving cam has a blocking section (4113) formed on one side thereof and includes a root section (4114) and a free end section (4115). The dimension of the root section is larger than that of the free end section to prevent the root section from breaking when the blocking section engages the braking section of the cover hole.

3 Claims, 5 Drawing Sheets

ELECTRICAL CONNECTOR HAVING DRIVING CAM

BACKGROUND OF THE INVENTION

1. Field of the Invention

The present invention relates to an electrical connector adapted for electrically interconnecting a chip module with a circuit board, and more particularly to an electrical connector having a driving cam.

2. Description of Related Art

A conventional electrical connector related to the present invention usually includes a rectangular base, a rectangular cover movable on the base, and a driving device extending through and attached on the base and the cover. The cover is adapted to support a chip module, while the base is adapted to mount on a circuit board. The driving device is usually a rotary cam which can be rotated to drive the cover to slide relative to the base. A blocking section projects from an upper side portion of the cam and the cover has a corresponding braking section for preventing the blocking section from over-rotating. U.S. Pat. Nos. 6,146,178, 6,231,366, 6,250,941 and 6,254,415 all disclose such an electrical connector. The blocking section disclosed in U.S. Pat. No. 6,250,941 is small and a root section thereof has the same dimension as the remaining portion. However, when the cam rotates excessively, the blocking section gives an impact to the braking section of the cover, and the stress that the root section of the blocking section simultaneously endures arrives at a maximum. Accordingly, when the rotating torque of the cam exceeds the allowable limit, it is easy for the blocking section to break along the root section thereof, thereby resulting in the malfunction of the whole driving device.

Hence, it is requisite to provide an improved cam mechanism for an electrical connector.

SUMMARY OF THE INVENTION

Accordingly, the object of the present invention is to provide an electrical connector having an improved driving cam which can prevent the blocking section of the driving cam from breakage.

In order to achieve the above-mentioned object, an electrical connector in accordance with the present invention comprises a base having a plurality of passageways receiving a plurality of terminals therein, a cover slidably mounted on the base and having a plurality of through holes aligning with and communicating with the plurality of passageways of the base, and a driving cam extending through and rotatablely attached to the base and the cover. A base hole is defined at one end of the base. The cover defines a cover hole aligning with and communicating with the base hole, and a braking section is defined in the cover hole. The driving cam has a blocking section formed on one side thereof and the blocking section comprises a root section and a free end section. The dimension of the root section is larger than that of the free end section to prevent the root section from breaking when the blocking section engages the braking section of the cover hole.

Other objects, advantages and novel features of the invention will become more apparent from the following detailed description of the present embodiment when taken in conjunction with the accompanying drawings.

DETAILED DESCRIPTION OF THE INVENTION

Reference will now be made in detail to the preferred embodiment of the present invention.

Figure 1:
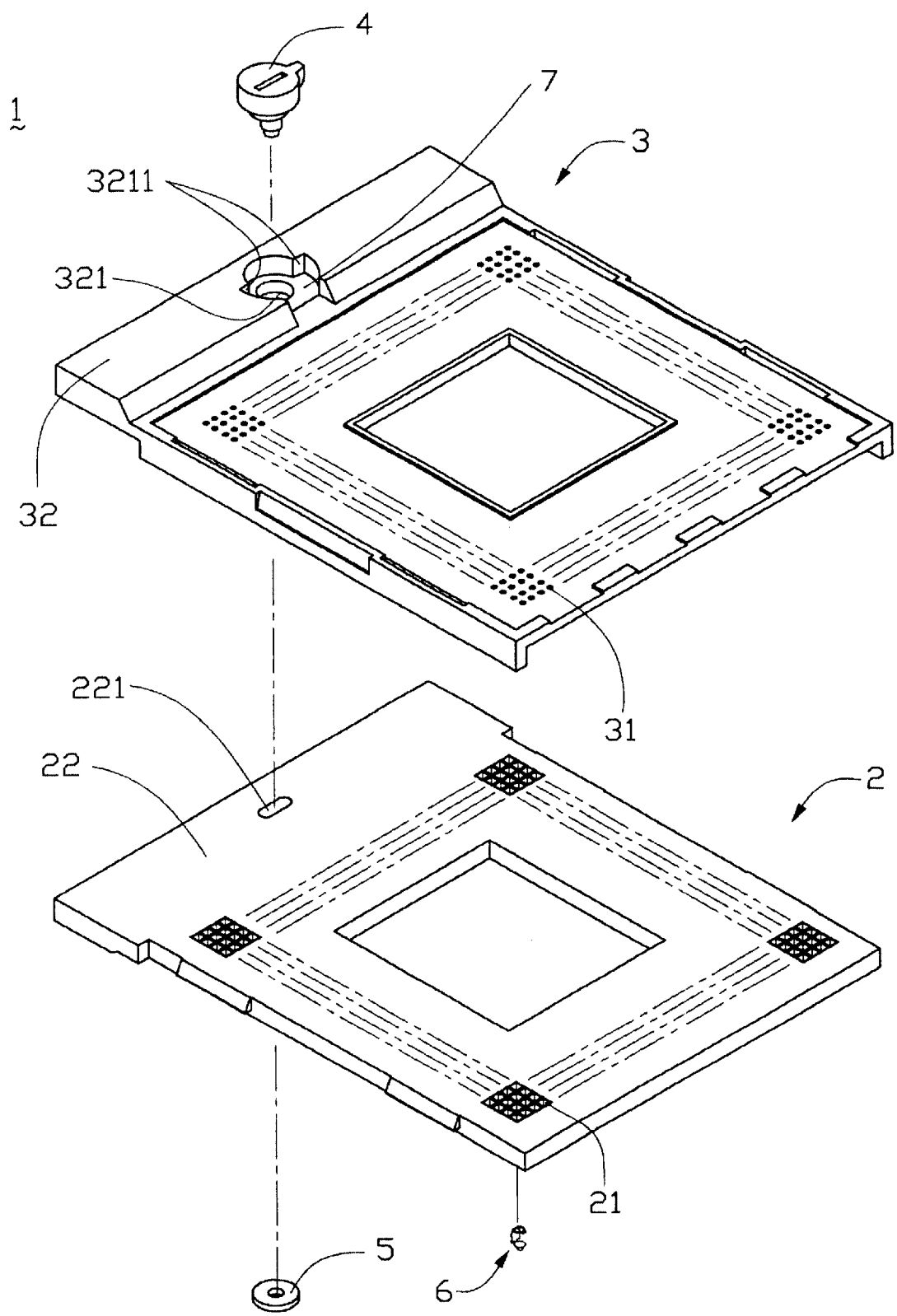
FIG. 1 is an exploded, perspective view of an electrical connector in accordance with the present invention.
Figure 2:
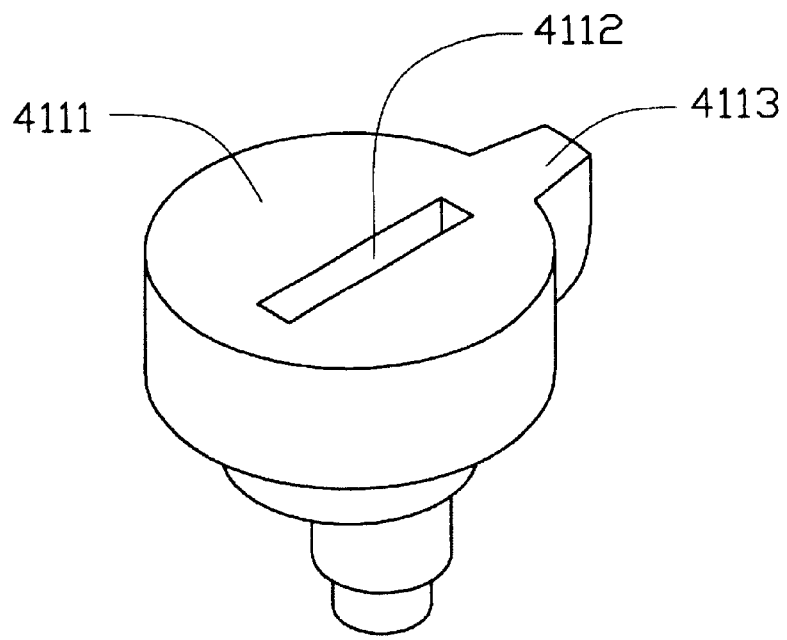
FIG. 2 is a perspective view of a driving cam of the electrical connector in accordance with the present invention.
Figure 3:
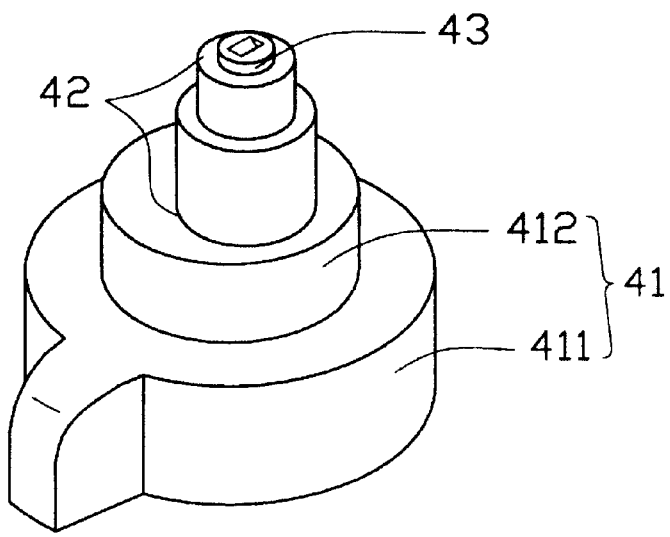
FIG. 3 is a perspective view of the driving cam from a bottom aspect.
Figure 6:
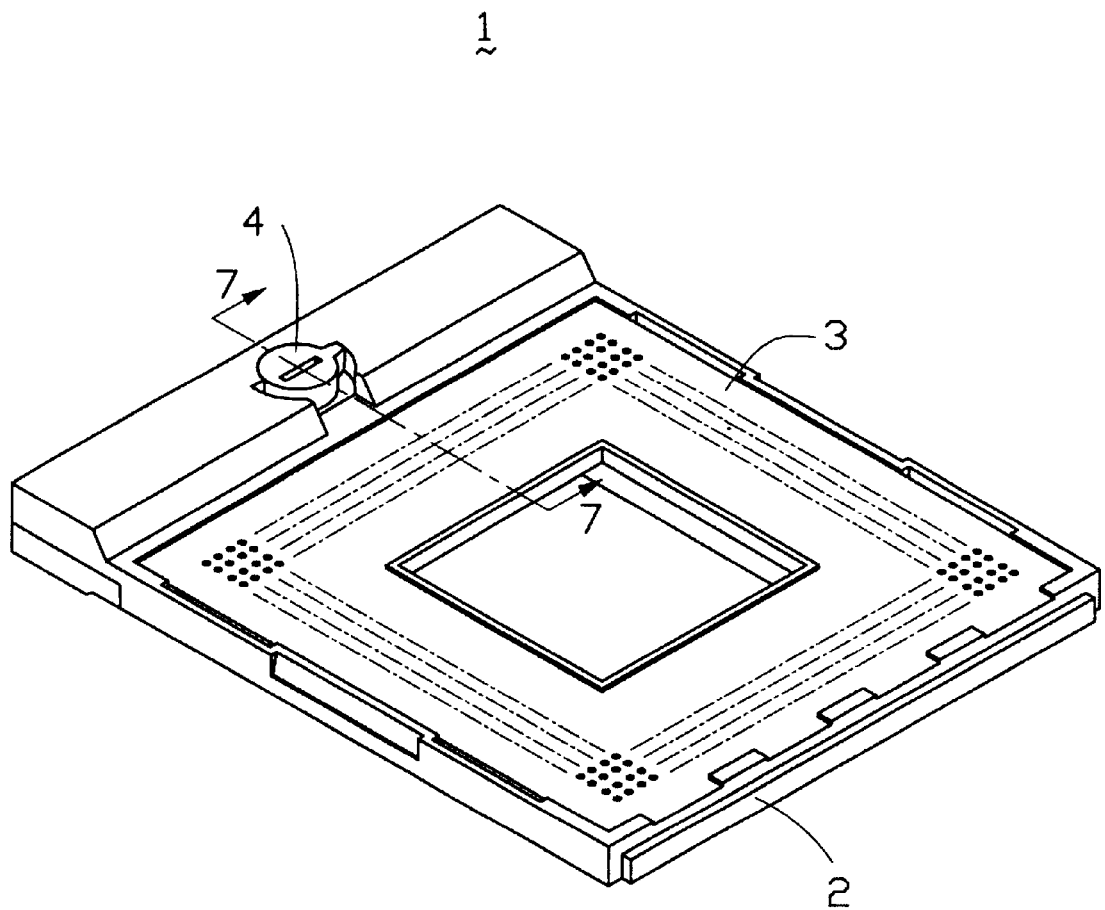
FIG. 6 is an assembled, perspective view of FIG. 1.
Figure 7:
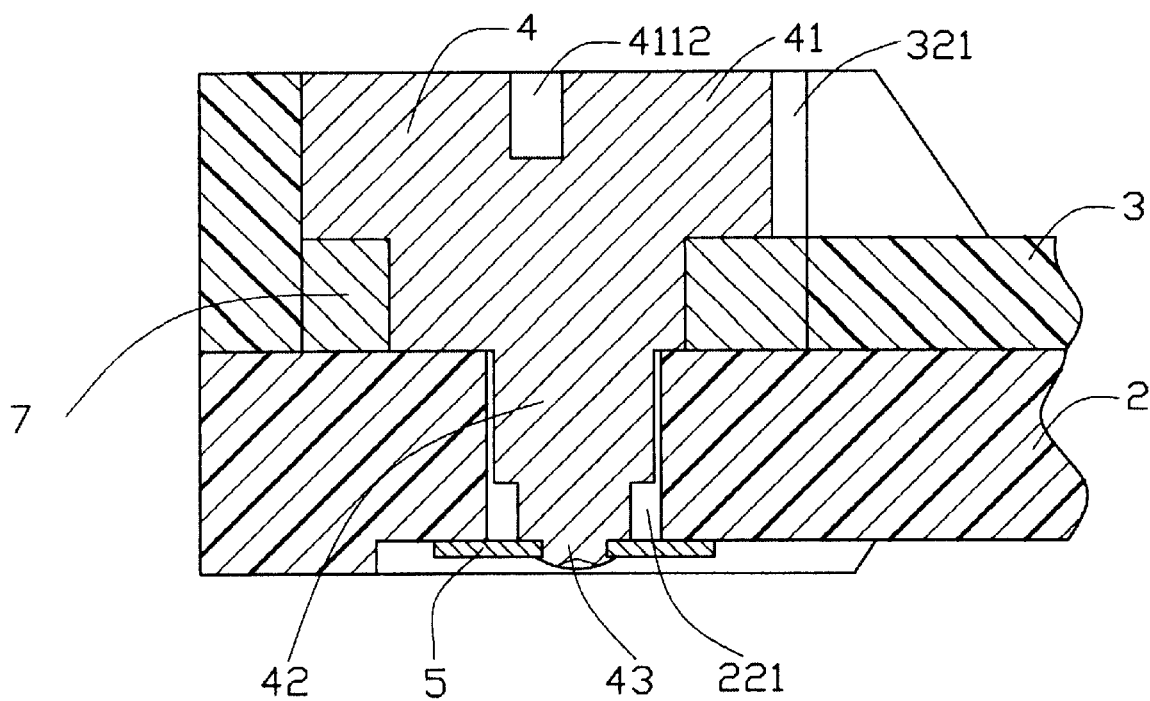
FIG. 7 is a partly cross-sectional view taken along line 7—7 of FIG. 6.

Referring to FIGS. 1, 6 and 7, an electrical connector 1 in accordance with the present invention comprises a rectangular base 2, a rectangular cover 3 slidably assembled to the base 2, a driving cam 4 extending through and attached to the base 2 and the cover 3, and a riveting piece 5 riveted at one end of the driving cam 4. A plurality of passageways 21 is defined in the base 2 receiving a plurality of terminals 6 therein. The base 2 comprises a base platform 22 formed at one end thereof and defining a base hole 221.

The cover 3 is adapted for supporting a chip module (not shown). A plurality of through holes 31 is defined in the cover 3 aligning with and communicating with the plurality of passageways 21 of the base 2 for receiving conductive pins (not shown) of the chip module. The cover 3 has a cover platform 32 corresponding to the base platform 22 of the base 2. The cover platform 32 defines a step-shaped cover hole 321 corresponding to the base hole 221 of the base platform 22. When the cover 3 is mounted onto the base 2, the base hole 221 communicates with the cover hole 321, and the driving cam 4 sequentially passes through the cover hole 321 and the base hole 221 and is received therein. The cover hole 321 defines two shoulder-shaped braking sections 3211 in the side wall. A metal washer 7 is mounted in the cover hole 321 for reducing frictional force and preventing the plastic walls of the cover hole 321 from fraying when the driving cam 4 is rotated.

Referring to FIGS. 2–5 and 7, the driving cam 4 is step-shaped and includes a driving section 41, a rotating section 42 and a riveting section 43. The rotating section 42 and the riveting section 43 have a same axis which is parallel to and offset a predetermined distance from the axis of the driving section 41. The driving section 41 is received in the cover hole 321 of the cover 3 and the riveting section 42 is received in the base hole 221 of the base 2. The riveting section 43 is riveted with the riveting piece 5 for preventing the cover 3 and the base 2 from breaking off. The driving section 41 is divided into a top portion 411 and a spindle portion 412. The top portion 411 defines a rectangular operating recess 4112 in a top surface 4111 thereof for allowing an external tool such as a screwdriver to insert therein to operate. A blocking section 4113 projects from an upper side portion of the top portion 411, and includes a root section 4114 and a free end section 4115.

Figure 4:
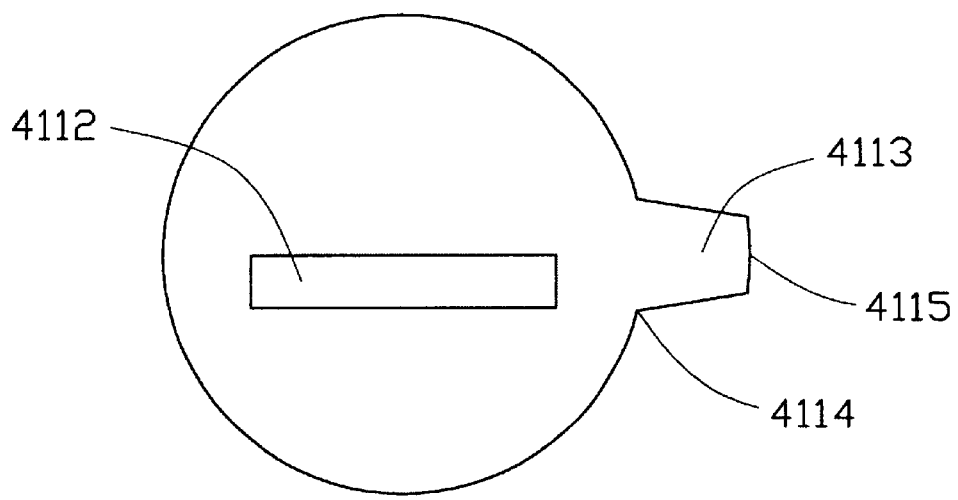
FIG. 4 is a top view of the driving cam of FIG. 2.
Figure 5:
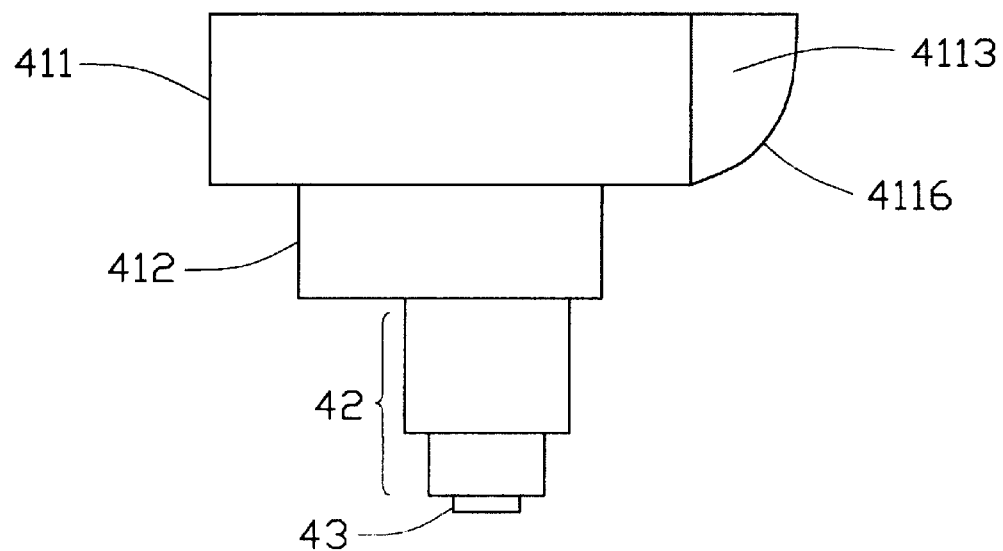
FIG. 5 is a side view of the driving cam of FIG. 2.

When the base 2 and the cover 3 are assembled together, the base 2 and the cover 3 are movable relative to each other between an open position and a closed position by rotating the driving cam 4. In the open position, the cover 3 is located above the base 2 and is offset from the base 2 a predetermined distance. When the chip module is put on the cover 3 with its conductive pins extending through corresponding through holes 31 of the cover 3 and passageways 21 of the base 2, the external tool is applied to compel the driving cam 4 to rotate at a predetermined angle for engaging the braking section 3211 of the cover hole 321. Accordingly, the cover 3 is driven by the driving section 41 of the driving cam 4 to move relative to the base 2 to the closed position where the offset distance is compensated and where the conductive pins of the chip module contact with the terminals 6 received in the passageways 21 of the base 2 to form an electrical connection therebetween. When the blocking section 4113 is rotated to engage the braking section 3211 of the cover hole 321, the braking section 3211 applies a resisting force to the blocking section 4113. To prevent the blocking section 4113 of the driving cam 4 from being broken, the root section 4114 of the blocking section 4113 has a dimension larger than that of the free end section 4115. As best shown in FIG. 4, the width of the blocking section 4113 gradually decreases toward the free end section 4115. Thus, when the blocking section 4113 receives the resisting force from the braking section 3211 of the cover hole 321, the stress that the blocking section 4113 endures is evenly distributed, thereby avoiding breakage of the blocking section 4113 along the root section 4114 thereof which is resulted from an excessively large rotating torque of the driving cam 4. As shown in FIG. 5, the end surface 4116 of the blocking section 4113 is also configured as a gradually retractive curved surface, in other words, the blocking section 4113 gradually decreases in length from the top to the bottom, thereby saving the material and reducing the production cost.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. An electrical connector for electrically interconnecting a chip module with a circuit board, comprising:

a base having a plurality of passageways receiving a plurality of terminals therein and a base hole defined at one end thereof;

a cover slidably mounted on the base, the cover having a plurality of through holes aligning with and communicating with the plurality of passageways, and a cover hole aligning with and communicating with the base hole, the cover hole defining a braking section; and a driving cam extending through the cover hole and the base hole and rotatablely assembled onto the base and the cover, the driving cam having a blocking section formed on a side thereof for engaging the braking section of the cover hole, the blocking section being received in the cover hole and comprising a root section and a free end section, the dimension of the root section being larger than that of the free end section to prevent the root section from breaking when the blocking section engages the braking section of the cover hole; wherein the base comprises a base platform formed at said one end, and said base hole is defined in the base platform; wherein the cover comprises a cover platform corresponding to the base platform, and said cover hole is defined in the cover platform; wherein the driving cam comprises a driving section received in the cover hole of the cover, a rotating section received in the base hole of the base and a riveting section engagable with a riveting piece, and the blocking section projects laterally from the driving section; wherein the rotating section and the riveting section of the driving cam have a same axis offset from the axis of the driving section.

2. The electrical connector as claimed in claim 1, wherein the blocking section of the driving cam has an end surface configured as a gradually retractive curved surface, the length of the blocking section gradually decreasing from the top to the bottom.

3. The electrical connector as claimed in claim 2, wherein the blocking section of the driving cam gradually decreases in width from the root section to the free end section.

* * * * *